United States Patent [19]

Groth, Jr.

[11] 4,325,129

[45] Apr. 13, 1982

[54] NON-LINEAR LOGIC MODULE FOR INCREASING COMPLEXITY OF BIT SEQUENCES

[75] Inventor: Edward J. Groth, Jr., Scottsdale, Ariz.

[73] Assignee: Motorola Inc., Schaumburg, Ill.

[21] Appl. No.: 145,418

[22] Filed: May 1, 1980

[51] Int. Cl.³ ............................................. H03K 3/84
[52] U.S. Cl. ..................................... 364/717; 328/61; 331/78
[58] Field of Search ................... 364/717; 331/78; 328/61, 63

[56] References Cited

U.S. PATENT DOCUMENTS

| | | | |
|---|---|---|---|
| 3,691,472 | 9/1972 | Bohman | 331/78 X |
| 3,831,013 | 8/1974 | Alsup et al. | 307/221 X |
| 3,911,216 | 10/1975 | Bartek et al. | 331/78 X |
| 3,911,330 | 10/1975 | Fletcher et al. | 307/221 X |
| 3,946,247 | 3/1976 | Collins et al. | 307/221 D |
| 3,947,705 | 3/1976 | Emmons | 307/221 D |
| 3,968,454 | 7/1976 | Busch | 331/78 |
| 4,032,763 | 6/1977 | Glitz | 364/717 |
| 4,038,565 | 7/1977 | Bharat | 307/221 D |
| 4,115,657 | 9/1978 | Morgan | 364/717 X |

OTHER PUBLICATIONS

Groth "Generation of Binary Sequences with Controllable Complexity", *IEEE Trans. on Infor. Theory*, vol. 1T-17, No. 3, May 1971, pp. 288-296.

*Primary Examiner*—David H. Malzahn
*Attorney, Agent, or Firm*—M. David Shapiro; Eugene A. Parsons

[57] ABSTRACT

A logic system for implementation of a feed-forward non-linear generator for producing a plurality of programmable complex sequences from an input bit stream.

2 Claims, 3 Drawing Figures

| | | | BIT POSITIONS FOR N=7 | | | | | | | | | | | SEQUENCE |
|---|---|---|---|---|---|---|---|---|---|---|---|---|---|---|
| 1 | 2 | 3 | 4 | 5 | 6 | 7 | 8 | 9 | 10 | 11 | 12 | 13 | 14 | NUMBER |
| 1 | 7 | 1 | 2 | 5 | 6 | 2 | 3 | 4 | 7 | 5 | 3 | 6 | 4 | 1 |
| 1 | 7 | 1 | 2 | 6 | 4 | 2 | 5 | 3 | 7 | 4 | 6 | 3 | 5 | 2 |
| 1 | 6 | 1 | 7 | 2 | 4 | 5 | 2 | 6 | 3 | 4 | 7 | 5 | 3 | 3 |
| 1 | 5 | 1 | 6 | 7 | 2 | 4 | 5 | 2 | 3 | 6 | 4 | 7 | 3 | 4 |
| 1 | 4 | 1 | 5 | 6 | 7 | 4 | 2 | 3 | 5 | 2 | 6 | 3 | 7 | 5 |
| 1 | 4 | 1 | 6 | 7 | 3 | 4 | 5 | 2 | 3 | 6 | 2 | 7 | 5 | 6 |
| 1 | 6 | 1 | 3 | 5 | 7 | 4 | 3 | 6 | 2 | 5 | 4 | 2 | 7 | 7 |
| 1 | 5 | 1 | 7 | 3 | 4 | 6 | 5 | 3 | 2 | 4 | 7 | 2 | 6 | 8 |
| 1 | 5 | 1 | 6 | 3 | 7 | 4 | 5 | 3 | 2 | 6 | 4 | 2 | 7 | 9 |
| 1 | 5 | 1 | 4 | 6 | 7 | 3 | 5 | 4 | 2 | 3 | 6 | 2 | 7 | 10 |
| 5 | 1 | 7 | 1 | 6 | 2 | 5 | 4 | 2 | 3 | 7 | 6 | 4 | 3 | 11 |
| 4 | 1 | 7 | 1 | 6 | 4 | 2 | 5 | 3 | 2 | 7 | 6 | 3 | 5 | 12 |
| 4 | 1 | 6 | 1 | 7 | 4 | 3 | 5 | 2 | 6 | 3 | 2 | 7 | 5 | 13 |
| 7 | 1 | 3 | 1 | 6 | 4 | 3 | 5 | 7 | 2 | 4 | 6 | 2 | 5 | 14 |
| 7 | 1 | 4 | 1 | 6 | 3 | 5 | 4 | 7 | 3 | 2 | 6 | 5 | 2 | 15 |
| 6 | 1 | 5 | 1 | 7 | 3 | 4 | 6 | 5 | 3 | 2 | 4 | 7 | 2 | 16 |
| 4 | 6 | 1 | 7 | 1 | 4 | 5 | 2 | 6 | 3 | 2 | 7 | 5 | 3 | 17 |
| 7 | 3 | 1 | 6 | 1 | 3 | 4 | 5 | 7 | 2 | 6 | 4 | 2 | 5 | 18 |
| 4 | 6 | 1 | 7 | 1 | 4 | 3 | 5 | 6 | 2 | 3 | 7 | 2 | 5 | 19 |
| 5 | 6 | 1 | 7 | 1 | 3 | 5 | 4 | 6 | 3 | 2 | 7 | 4 | 2 | 20 |
| 7 | 4 | 1 | 5 | 1 | 6 | 4 | 3 | 7 | 5 | 2 | 3 | 6 | 2 | 21 |
| 5 | 7 | 1 | 4 | 1 | 6 | 5 | 3 | 4 | 7 | 2 | 3 | 6 | 2 | 22 |
| 3 | 6 | 7 | 1 | 3 | 1 | 4 | 5 | 6 | 2 | 7 | 4 | 2 | 5 | 23 |
| 5 | 7 | 4 | 1 | 6 | 1 | 5 | 4 | 3 | 7 | 2 | 6 | 3 | 2 | 24 |
| 2 | 6 | 7 | 2 | 1 | 5 | 1 | 4 | 6 | 3 | 7 | 5 | 4 | 3 | 25 |
| 4 | 5 | 6 | 7 | 1 | 4 | 1 | 5 | 3 | 6 | 2 | 7 | 3 | 2 | 26 |

FIG 2

NON-LINEAR LOGIC MODULE FOR INCREASING COMPLEXITY OF BIT SEQUENCES

This invention was made under a contract (N00163-77-1108) with the United States Government and may be used for government purposes free of royalty payment to the assignee.

FIELD OF THE INVENTION

The invention relates to a non-linear logic module for generating complex bit sequences.

BACKGROUND OF THE INVENTION

Complex binary digital sequences are useful in secure code generators, error correcting code generators, anti-jam circuits and other spread spectrum systems. In *Generation of Binary Sequences With Controllable Complexity*, IEEE Transactions on Information Theory, Vol. IT-17, No. 3, May 1971, by E. J. Groth, a concept was set forth for generating pseudo random bit strings with controllable complexity by means of combinations of shift registers of variable span combined with multipliers and modulo-two adders. Particular sequencing rules are set out in that paper which provide useful configurations for non-linear generators.

It is desirable in such systems to be able to vary the complexity of the sequences. One means for accomplishing this flexibility is to connect a variety of shift register logic elements to a given shift register by means of a crossbar or other complex switching network in order to develop a series of different non-linear feed forward generators which meet the criteria of the IEEE Transactions paper, supra. This sort of system suffers when high operating speed is necessary to system requirements. In this case, the complexity of the physical configuration limits system speed and the system becomes inoperable.

Another desirable feature of such a system would allow rapid switching from one complexity or sequence to another. Any switching system incorporating relatively long wire lengths, as in a crossbar switching network, would also be restrictive in terms of switching time due to excessive capacitive loading.

A system for meeting optimum system requirements clearly requires the following sub-requirements to be observed:

(1) A maximum number of multipliers must be available to the system,
(2) Every span used in a given register complex must be unique, and
(3) There must be no common connections in the register complex.

SUMMARY OF THE INVENTION

The above requirements are met and shortcomings remedied by means of the instant invention by the use of a plurality of a maximum number of variable length—fixed length pairs of registers, each pair having both a serial and multiplied interconnection and all pairs being combined modulo-two at their outputs, meeting the three step criteria, supra, for maximum flexibility and flexibility of control.

It is, therefore, an object of the invention to combine modulo-two the outputs of a plurality of register pairs so that one register of each pair is of selectable variable length and the other register of the pair is of fixed length and so that no two of the plurality of fixed length registers are of the same length and so that no two of the plurality of variable length registers are of the same length.

It is another object of the invention to provide a plurality of register pairs of fixed and variable length wherein the maximum variable length plus the fixed register length in each pair is equal to the same total pair length of every other pair in the system, the output of each pair being added modulo-two with the outputs of all other pairs in the plurality of pairs of registers to form a binary sequence output of variable complexity.

It is still another object of the invention to provide a plurality of register pairs in which the first segment of each pair is of variable length and the second segment of each pair is of fixed length; means being supplied to enable efficient control of the length of each of the variable register segments.

These and other objects of the invention will become more readily understood upon study of the Detailed Description of the Invention together with the accompanying drawings in which:

FIG. 2 is a table of one-half the permitted sequence combinations for the 14 bit generators of FIG. 1.

DETAILED DESCRIPTION OF THE INVENTION

Figure 1:
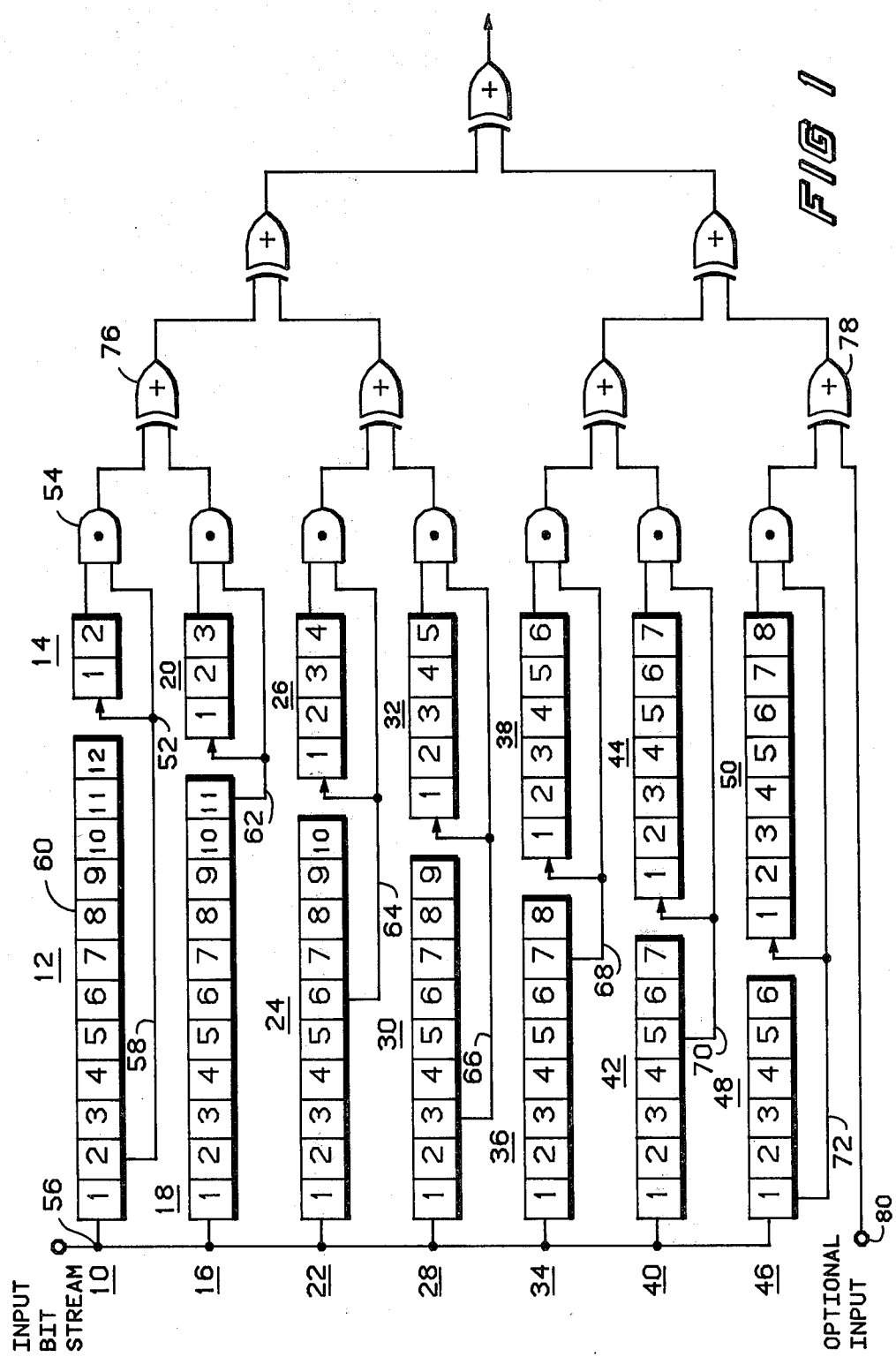
FIG. 1 is a block diagram of a preferred embodiment of the invention utilizing 14 bit length segmented registers.

Referring first to FIG. 1, it may be seen that, in block diagram form, the invention comprises segmented programmable registers 10, 16, 22, 28, 34, 40 and 46 (clock inputs not shown). Each of the segmented registers comprises a fixed length portion and a programmable variable length portion. For example, register 10 comprises variable length portion 12 and fixed length portion 14. Fixed portion 14 determines the span of delay (in clock periods) between the two sequences to be combined in, for example, multiplier 54. Of course, the length of the registers of FIG. 1 are for example only; the length and number of registers being variable to suit a particular application. Note that fixed length portions 14, 20, 26, 32, 38, 44 and 50 of registers 10, 16, 22, 28, 34, 40 and 46 have lengths of 2, 3, 4, 5, 6, 7 and 8 bits, respectively. A bit introduced at node 52 of register 10 produces an immediate input to AND gate 54 and an input delayed by two clock times via register portion 14. In the illustration of FIG. 1, programmable register portion 12 of register 10 is arranged to delay an input bit at node 56 by two clock times at node 52. Of course, other delay times may have been programmed into register portion 12 by using a different output point for wire 58. For example, if eighth stage 60 of register 12 had been utilized for the output into wire 58, the delay in transit of a bit from input node 56 to node 52 through register segment 12 would have been 8 clock times. Similarly, the other programmable register portions 18, 24, 30, 36, 42 and 48 may be programmed by selection of given register stages from which outputs to wires 62, 64, 66, 68, 70 and 72, respectively would be derived. In order to satisfy the complex binary digital number generation scheme according to *Generation of Binary Sequences With Controllable Complexity*, supra, a different tap point is selected for each of the register portions 12, 18, 24, 30, 36, 42 and 48. Now, looking at register portion 12, part of register 10 of FIG. 1, it may be seen that there are 12 numbered stages there. Since no two full registers may have a tap point at the twelfth stage there is no need to have any other programmable register portion as long as register 12. Similarly, there is no need for any other programmable register portion to be as long as register portion 18, which has 11 stages. And so forth. Therefor, each register portion 12, 18, 24, 30, 36, 42 and 48 is of a unique length but all lengths from 6 through 12 stages are represented. The shorter length programmable registers are associated with the lengthier fixed length registers and vice versa. This allows all possible combinations of bit timing since the programmable register length sets the position of the first bit of each bit pair in the output word and the fixed register associated with any given programmable register sets the spacing between that bit pair. A bit pair is defined as a given bit and its delayed counterpart. It may be noted that any given combination of programmable and fixed delay must not exceed the total word length. Therefore, in the case illustrated in FIG. 2 (a 14 bit output word), the sum of the maximum programmable register bit delay length and the fixed register bit delay length, therewith associated, need not exceed 14. This may be seen more clearly by inspection of the Table of FIG. 2. In sequence numbers 1 through 10 (right-hand column 100), bit 1 appears in positions one and three. (Bit 1 refers to the first input bit in the bit stream 74 applied to the inputs of the programmable registers. (See FIG. 1) Bit 2 is the second bit in that stream, and so forth.) This means that there is no delay for the first bit of this pair and the second bit of the pair is delayed two clock times. Since every programmable register has at least a one bit delay, the delay generated if the first output bit is tapped from the first delay stage of the programmable register, this one stage delay is a reference delay and may be considered as zero delay. Of course, alternatively, the input bit could be programmed as the first output bit with no delay and some register stages would be eliminated in such a configuration.

Referring again to FIG. 2, it will be seen that bit 2 appears in positions four and seven of sequence number 1, reference numeral 100. This means that the programmable register for the bit 2 pair is arranged for a four clock time delay; that is, the output of the programmable register is taken from the fifth stage. The associated fixed length register must then be the three stage fixed length register (20, if the scheme of FIG. 1 is used) to provide the second bit of the pair in the seventh position. This logic may be extended for determination of all programmable register-fixed register combinations for any given sequence number of the table of FIG. 2. The table of FIG. 2 shows 26 sequences. There are also 26 more reverse sequences, which are not shown, for a total of 52 sequences. Of course, other complex sequences are possible as will be well understood by one having skill in this art. (The reader is again directed to *Generation of Binary Sequences with Controllable Complexity*, supra.) The partial block diagram of FIG. 1 also includes multipliers such as 54 and "exclusive OR" adders such as 76 for combining the programmable and fixed register portion outputs and for combining, modulo-two, the outputs of the plurality of segmented registers 10, 16, 22, 28, 34, 40 and 46, for example. A spare input 80 to one of the modulo-two adders, such as 78, may be provided for the purpose of combining the output bit stream of the system of FIG. 1 with another bit stream. This may sometimes be desirable where combination with an equally balanced 0-1 bit stream is required, for example.

Figure 3:
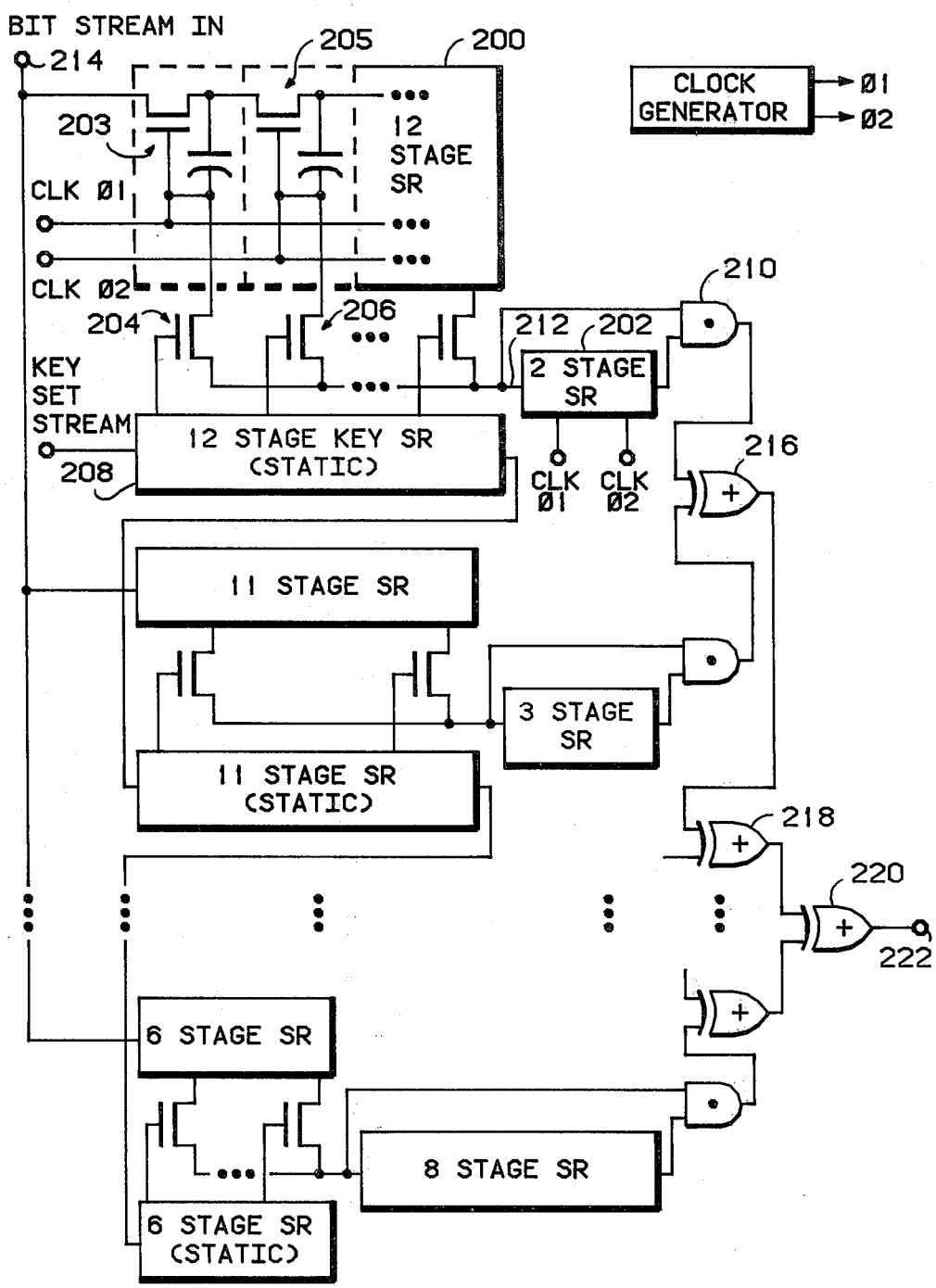
FIG. 3 is a partial schematic diagram of the block diagram of FIG. 1.

A preferred embodiment of the partial block diagram of FIG. 1 is shown in schematic diagram form in FIG. 3. A typical segmented register is shown, 200, 202. Switches 204, 206 are connected to the output of each stage 203, 205 or programmable segment 200. Switch control register 208 is a static shift register in which a key word may be stored. This key word comprises all "zero" bits except for a single "one". The single "one" bit in register 208 enables only one of the switches (such as 204 and 206) and thus determines which stage of programmable register 200 will supply the output to multiplier 210 and to input 212 of fixed length register 202. Clock lines CLK 01 and CLK 02 supply clock signals for operation of registers 200, 202 and all other such registers. For each pair of clock signals, registers 200, 202 shift input bit stream 214 one stage to the right.

The other segmented registers of FIG. 3 may also be programmed and operate in a similar fashion. Exclusive OR gates, such as 216, 218 and 220 serve to add the outputs of the segmented registers, modulo-two and provide the required output sequences at terminal 222 in response to the setting of a given key word into the various static shift registers such as 208. Static shift registers, such as 208, may be loaded either serially or in parallel fashion, but they are shown loaded serially in FIG. 3. If loaded in parallel, the key words may be changed between clock pulse inputs to the segmented registers and new complex sequences may be generated "on-the-fly". Of course, other systems for switching the variable register segment lengths might also be employed. For example, simple mechanical switches might be utilized (not shown).

The art of developing efficient complex sequences which indicate the key words which lead to these sequences, is taught in the prior art, *Generation of Binary Sequences with Controllable Complexity*, supra.

While the invention has been particularly shown and described with reference to a preferred embodiment thereof, it will be understood by those skilled in the art that various other modifications and changes may be made to the present invention from the principles of the invention described above without departing from the spirit and scope thereof, as encompassed in the accompanying claims. Therefore, it is intended in the appended claims to cover all such equivalent variations as come within the scope of the invention as described.

I claim:

1. A non-linear digital generator circuit for producing controllably complex bit sequences comprising in combination:

a plurality of shift registers each being of predetermined bit length, each of said plurality of shift registers comprising:
 a first segmented portion being controllable as to a bit delay length between an input thereto and an output thereof; and
 a second segmented portion having a fixed bit length for implementing a predetermined span between an input thereto and an output thereof, said input being derived from said output of said first segmented portion;
 means for controlling said bit length of each of said plurality of first segmented portions of said plurality of shift registers;
 a plurality of means for combining said inputs and outputs of each of said second segmented portions, each of said combining means having an output thereof; and
 means for modulo-two adding said outputs of said plurality of said combining means.

2. The circuit according to claim 1 further comprising an optional input to said modulo-two adding means for inputting a bit string.

* * * * *